(12) United States Patent
Dennison

(10) Patent No.: US 7,323,707 B2
(45) Date of Patent: Jan. 29, 2008

(54) INITIALIZING PHASE CHANGE MEMORIES

(75) Inventor: Charles H. Dennison, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 10/881,664

(22) Filed: Jun. 30, 2004

(65) Prior Publication Data

US 2006/0001016 A1    Jan. 5, 2006

(51) Int. Cl.
*H01L 29/02*    (2006.01)
(52) U.S. Cl. .................. 257/2; 438/95; 257/E27.004; 365/163
(58) Field of Classification Search ............ 438/60–63, 438/75–78, 95–97, 102; 257/2–5, 42, E27.004; 365/163
See application file for complete search history.

(56) References Cited

U.S. PATENT DOCUMENTS

| 3,573,757 A | | 4/1971 | Adams ........................ 340/173 |
| 4,845,533 A | * | 7/1989 | Pryor et al. ..................... 257/4 |
| 5,406,509 A | | 4/1995 | Ovshinsky et al. .......... 365/113 |
| 5,534,711 A | | 7/1996 | Ovshinsky et al. ............. 257/3 |
| 5,534,712 A | * | 7/1996 | Ovshinsky et al. ............. 257/3 |
| 6,795,338 B2 | | 9/2004 | Parkinson et al. ........... 365/163 |
| 6,859,390 B2 | | 2/2005 | Pashmakov ................. 365/163 |
| 2004/0114413 A1 | | 6/2004 | Parkinson et al. .......... 365/100 |
| 2004/0257848 A1 | | 12/2004 | Chen et al. .................. 365/113 |
| 2004/0257872 A1 | | 12/2004 | Chen et al. .................. 365/184 |
| 2005/0041467 A1 | | 2/2005 | Chen .......................... 365/184 |

OTHER PUBLICATIONS

Y. Chen et al., *An Access-Transistor-Free (0T/1R) Non-Volatile Resistance Random Access Memory (RRAM) Using a Novel Threshold Switching, Self-Rectifying Chalcogenide Device*, IEDM 03-905, IEEE 2003, pp. 37.4.1-37.4.4.
Bernacki, "Total Dose Radiation Response and High Temperature Imprint Characteristics of Chalcogenide Based RAM Resistor Elements", IEEE Transaction on Nuclear Science, vol. 47, No. 6, pp. 2528-2532, Dec. 2000.
Chen et al., "An Access-Transistor-Free (0T/1R) Non-Volatile Resistance Random Access Memory (RRAM) Using a Novel Threshold Switching, Self-Rectifying Chalcogenide Device", Macronix International Co., 2003.
Van Landingham, "Circuit Applications of Ovonic Switching Device", IEEE Transactions on Electron Devices, vol. ED-20, No. 2, pp. 178-187, Feb. 1973.

* cited by examiner

*Primary Examiner*—Brook Kebede
(74) *Attorney, Agent, or Firm*—Trop, Pruner & Hu, P.C.

(57) ABSTRACT

A thin film phase change memory may be provided with a layer which changes between amorphous and crystalline states. The threshold voltage of that layer may be increased in a variety of fashions. As a result of the threshold increase, it is possible to transition cells, initially fabricated in the set or low resistance state, into the reset or high resistance state. In one advantageous embodiment, after such initialization and programming, the threshold voltage increase is eliminated so that the cells operate thereafter without the added threshold voltage.

14 Claims, 3 Drawing Sheets

INITIALIZING PHASE CHANGE MEMORIES

BACKGROUND

This invention relates generally to thin film phase change memories.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance or threshold voltage (Vt) value, that value is retained until reprogrammed, even if power is removed. This is because the programmed value represents a phase or physical state of the material (e.g., crystalline or amorphous).

Initially, in the manufacture of thin film phase change memories, all the devices are fabricated in the low resistance or set state. Generally, an access device or select transistor is utilized in series with the memory element to isolate the memory element. The select device provides isolation (very high resistance when not selected). Even if all the the phase change memory cell memory elements, as fabricated, come out in the fully crystalline or low resistance state there will be no problem initially programming large arrays from the very low multiple resistance paths between all of the word lines and bit lines because the necessary resistance can be provided by the select devices. The presence of the select devices may increase the number of processing steps and may increase the size of the cell and, therefore, the size and cost of the overall memory.

Thus, there is a need for a way to make thin film phase change memory devices without an access or select device.

DETAILED DESCRIPTION

Figure 1:
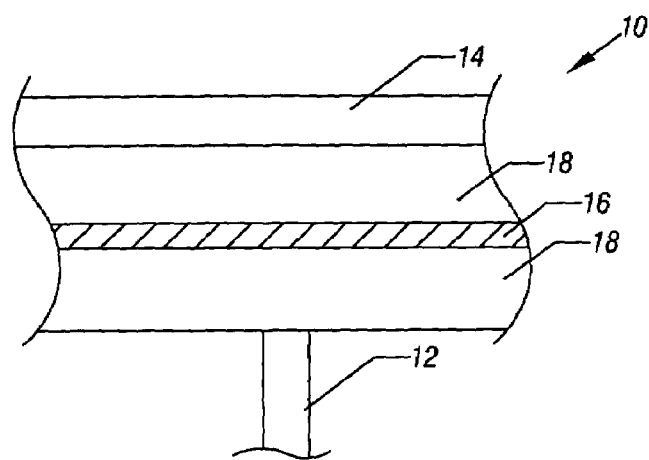
FIG. 1 is an enlarged, cross-sectional view of a cell in accordance with one embodiment of the present invention.

Referring to FIG. 1, a thin film phase change memory 10 may include an upper electrode 14 and a lower electrode 12. In one embodiment, a phase change layer 18 includes a portion or volume that actually transitions between amorphous and crystalline phases, is provided underneath the upper electrode 14. For example, the film 18 may be formed of a chalcogenide layer. The layer 18, as initially fabricated, is in its lower resistance, crystalline, or set state.

Figure 4A:
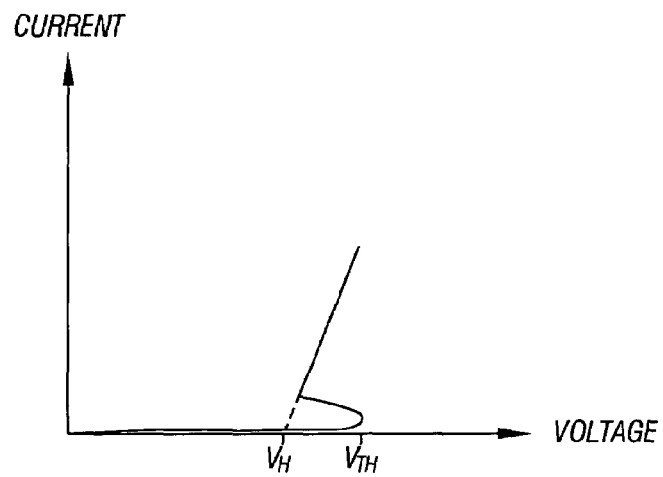
FIG. 4A is a representative i-v curve for a more strongly reset device.
Figure 4B:
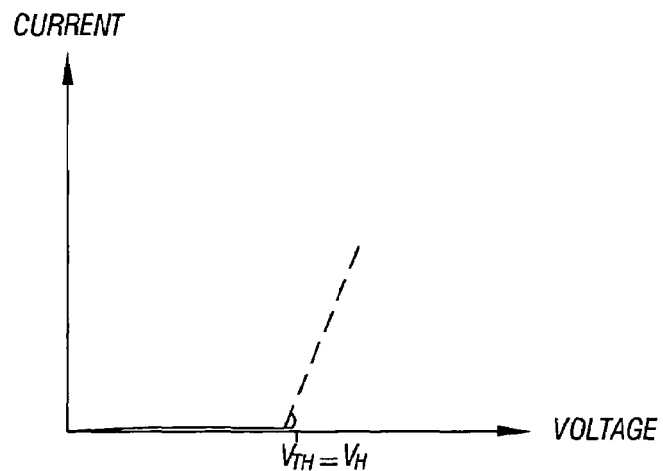
FIG. 4B is a representative i-v curve for a more lightly reset device.
Figure 5:
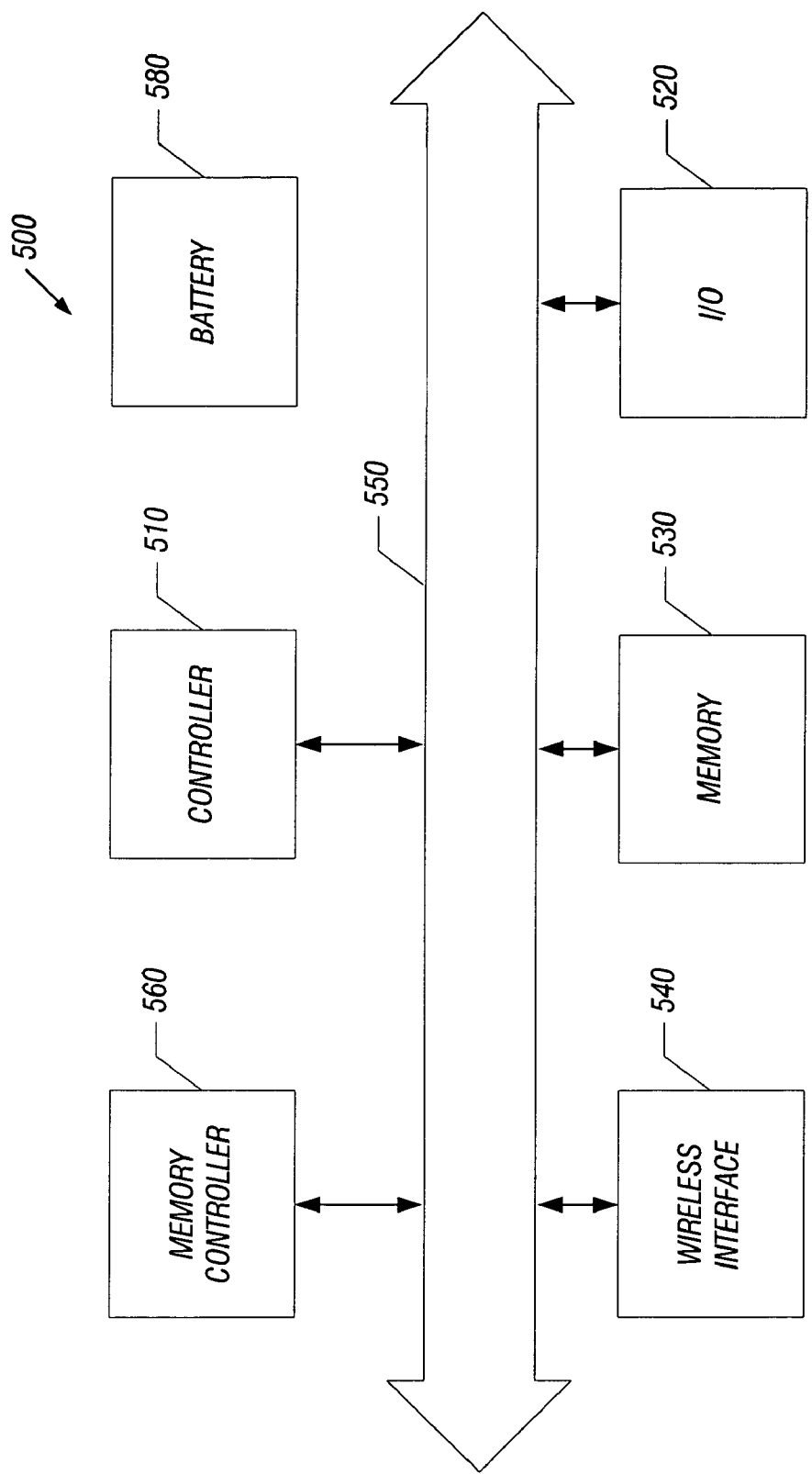
FIG. 5 is a system in accordance with one embodiment of the present invention.

Within the layer 18 is a material 16 which does not crystallize and remains substantially intact upon all the final processing steps. The layer 16 may be in direct, face-to-face contact with the layer 18 in one embodiment (such as directly over lower electrode 12 and under layer 18). Therefore, it is always in the uncrystallized, amorphous, or higher resistance state. As a result, the layer 16 provides isolation via thresholding during the array initialization when the bits of a subarray (e.g., a subarray of 10×10) are programmed for the first time to either a strong (higher threshold voltage) (see FIG. 4A) or lighter (lower threshold voltage) reset state (see FIG. 4B). It is potentially desirable that, during this array initialization or initial programming, the layers 16 and 18 intermix during the heating of the materials. Therefore, the operation of the layer 16 in providing a higher resistance or higher threshold voltage is eliminated after initialization of the cell 10 prior to operating the memory array as a storage system.

The layer 16 may be formed of a variety of materials that always exhibit an amorphous state that are generally referred to as an "Ovonic Threshold Switch" (OTS). An "Ovonic Threshold Switch" is a device (with two terminals) designed to switch rapidly from a relatively non-conducting state into a dynamic conductive state upon application of a voltage exceeding the threshold voltage, $V_{th}$, but which returns to the relatively non-conducting state when current through the device falls below the holding current value, $I_H$. Two examples of OTS compositions are OTS1 and OTS2 forms of chalcogenide. The OTS1 chalcogenide is an alloy of titanium, arsenic, germanium, silicon, and indium in the proportions of 39, 32, 9, 19, and 1. The OTS2 chalcogenide is a mixture of tellurium, arsenic, germanium, selenium, and sulfur in the ratio of 16, 13, 15, 55, and 1. The layer 16 may be very thin relative to the thickness of the layer 18 in one embodiment.

The upper electrode 14 may be a continuous column line or individually segmented electrodes. The lower electrode 12 may be individual plugs, a continuous bottom row, or an individual pore in some embodiments of the present invention.

The layer 16 provides isolation via its threshold voltage during array initialization where all of the bits are then programmed, in discrete groups of cells at a time, to a light or strong reset state.

In one embodiment, the phase change layer 18 may be suitable for non-volatile memory data storage. The phase change layer 18 may be a material having electrical properties (e.g., resistance or threshold voltage) that may be changed through the application of energy such as, for example, heat, light, voltage potential, or electrical current.

Examples of phase change materials may include a chalcogenide material. A chalcogenide material may be a material that includes at least one element from column VI of the periodic table or may be a material that includes one or more of the chalcogen elements, e.g., any of the elements of tellurium, sulfur, or selenium. Chalcogenide materials may be non-volatile memory materials that may be used to store information.

In one embodiment, the layer 18 may be chalcogenide element composition from the class of tellurium-germanium-antimony ($Te_xGe_ySb_z$) material or a GeSbTe alloy, although the scope of the present invention is not limited to just these materials.

In one embodiment, if the layer 18 is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the layer 18 in the substantially amorphous state is greater than the resistance of the memory material in the substantially crystalline state. Accordingly, in this embodiment, the memory material may be adapted to be altered to a particular one of a number of resistance values within a range of resistance values to provide digital or analog storage of information.

Programming of the memory material to alter the state or phase of the material may be accomplished by applying voltage potentials to the electrodes 12 and 14, thereby generating a voltage potential across the layer 18. An electrical current may flow through a portion of the layer 18 in response to the applied voltage potentials, and may result in heating of the layer 18.

This controlled heating and subsequent controlled cooling may alter the memory state or phase of at least a portion of the layer 18. Altering the phase or state of the layer 18 may alter an electrical characteristic of this portion. For example, resistance of the material may be altered by altering its phase. Either all or a portion of the phase change memory material may be altered during the writing pulse (i.e. only a portion/region of layer 18 adjacent to either the upper or lower electrodes 14, 12 may be phase changed during the write operation). In one embodiment primarily the portion of layer 18 that under goes phase change is the region that is adjacent to the smaller lower electrode 12. The layer 18 may also be referred to as a programmable resistive material or simply a programmable resistance material.

In one embodiment, a voltage pulse with a potential difference of about 0.5 to 1.5 volts may be applied across a portion of the memory material by applying about 0 volts to a lower electrode 12 and about 0.5 to 1.5 volts to an upper electrode 14. A current flowing through the memory material in response to the applied voltage potentials may result in heating of the memory material. This heating and subsequent cooling may alter the memory state or phase of the material.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material may be heated to a relatively higher temperature and then subsequently cooled at a fast rate to amorphisize memory material and "reset" memory material. Heating the volume or memory material to a relatively lower crystallization temperature may crystallize memory material and "set" memory material. Various resistances of memory material may be achieved to store information by varying the amount of current flow and duration through the volume of memory material, or by tailoring the edge rate of the trailing edge of the programming current or voltage pulse (that may impact the cooling rate of the select memory element).

The information stored in memory material may be read by measuring the resistance of the memory material. As an example, a read current may be provided to the memory material using opposed electrodes 12, 14 and a resulting read voltage across the memory material may be compared against a reference voltage using, for example, the sense amplifier (not shown). The read voltage may be proportional to the resistance exhibited by the memory storage element.

In a low voltage or low field regime, the cell 10 is off and may exhibit very high resistance in some embodiments. The off resistance can, for example, range from 50,000 ohms to greater than 10 gigaohms at a bias of half the threshold voltage. The device may remain in its off state until a threshold voltage $V_T$ or threshold current $I_T$ switches the device to a highly conductive, low resistance on state. The voltage across the device after turn on drops to a slightly lower voltage, called the holding voltage $V_H$ and remains very close to this holding voltage. In one embodiment of the present invention, as an example, the threshold voltage may be on the order of 1.1 volts and the holding voltage may be on the order of 0.9 volts.

After passing through the snapback region, in the on state, the device voltage drop remains close to the holding voltage as the current passing through the device is increased up to a certain, relatively high, current level. Above that current level the device remains on but displays a finite differential resistance with the voltage drop increasing with increasing current. The device may remain on until the current through the device is dropped below a characteristic holding current value that is dependent on the area of the material and may be impacted by the upper and lower electrodes 14, 12 utilized to form the device.

Thus, the cells, subarray by subarray, may be addressed and programmed to a reset state. In the process, the layers 16 and 20 may be heated, may melt, and may intermix. Thereafter, the layer 16 may no longer be maintained. In some embodiments, no select or access device is needed for the cells. This may result in larger memory arrays of smaller size and lower cost in some embodiments. In this embodiment the memory cells are no longer programmed between a low resistance set state and reset state, but rather a light reset and strong reset with both states having a volume of amorphous or semi-amorphous region of chalcogenide present, but the strong reset state havin a larger volume of amorphous chalcogenide resulting in higher threshold voltage.

Figure 2A:
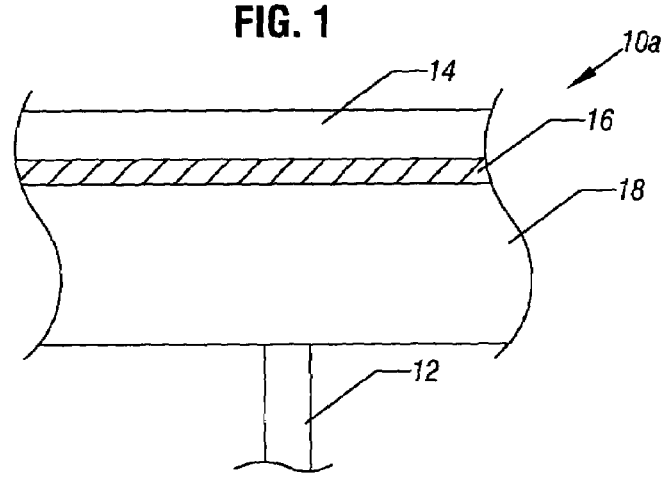
FIG. 2A is an enlarged, cross-sectional view of a cell in accordance with another embodiment of the present invention.

Referring to FIG. 2A, the cell 10a is effectively the same as the cell 10 shown in FIG. 1, except that the upper portion of the layer 18 is omitted.

Figure 2B:
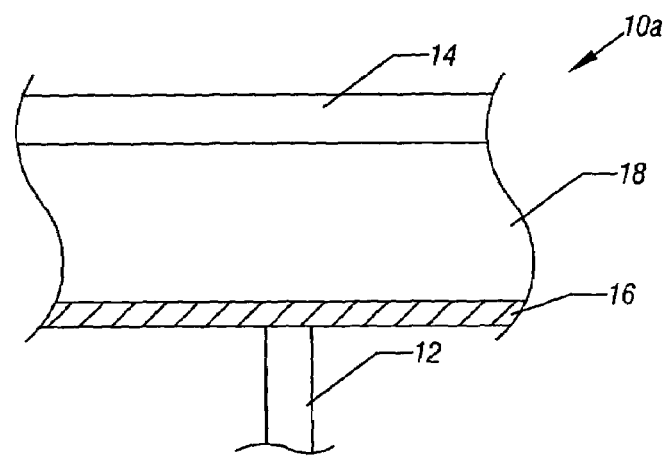
FIG. 2B is an enlarged, cross-sectional view of a cell in accordance with another embodiment of the present invention.

Referring to FIG. 2B, the cell 10b is effectively the same as the cell 10 shown in FIG. 1, except that the lower portion of the layer 18 is omitted.

Figure 3:
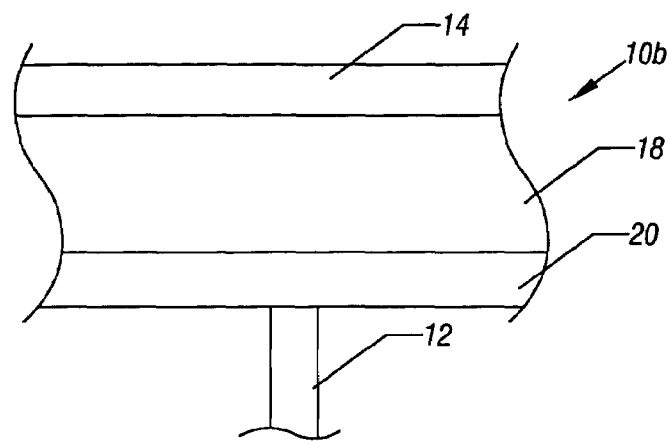
FIG. 3 is an enlarged, cross-sectional view of a cell in accordance with still another embodiment of the present invention.

Referring to FIG. 3, in accordance with another embodiment of the present invention, the layer 16 may be replaced with a layer 20 in the form of a thin dielectric breakdown layer. The breakdown layer 20 may, for example, be silicon dioxide, silicon nitride, or aluminum oxide, to mention a few examples. When the product comes out of the fabrication facility, the goal of the array initialization is to initially, for example, in discrete groups of cells, breakdown the breakdown layer 20. Effectively, the breakdown layer 20 enables individual cells to be addressed and programmed despite the fact that all of the cells, as fabricated, come out in the lower resistance set state.

When a sufficient voltage is applied across the electrodes 14, 12 during initialization of a subarray of cells, the breakdown layer 20 permanently breaks down forming a small, vertical conductive pore through the layer 20. The pore thereafter functions as a conductive path such that the layer 20 may not affect the threshold voltage of the cell after initialization in some embodiments. As a result of initialization, the layer 18 is initially placed in the higher resistance, amorphous, or reset state. The initialization then proceeds to repeat the process with other subarrays of cells. Thereafter, selected cells may be programmed to either a lightly reset or strongly reset state as necessary to store actual data.

The layer 20 may be of a thickness such that it may break down at voltages between one and four volts in one embodiment. Thus, the layer 20 may be between about 10 and about 40 Angstroms in one embodiment.

The difference between a lightly reset bit and a strongly reset bit basically is a function of the difference between the holding voltage and the threshold voltage. In the lightly reset bit, this difference is relatively small. In the strongly reset bit the difference between the holding and threshold voltages may be substantial. In some embodiments, it may be more desirable to go to the stronger reset bit initially during the initial programming of the array to the reset state because the stronger reset bit has better margin for parasitic leakage currents while initializing the full array.

Turning to FIG. 4, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or phase change memory 10-10b illustrated in FIGS. 1-3.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
    a pair of spaced electrodes;
    a phase change material between said electrodes; and
    a second material between said electrodes that increases the threshold voltage of said phase change material, wherein said second material includes chalcogenide.

2. The memory of claim 1 wherein said second material does not convert from an amorphous state.

3. The memory of claim 1 wherein said second material is between said phase change material and the lower of said electrodes.

4. The memory of claim 1 wherein said second material is formed within said phase change material.

5. The memory of claim 1 wherein said second material to break down when said memory is programmed.

6. The memory of claim 5 wherein said second material to form a pore when said memory is programmed.

7. The memory of claim 6 wherein said second material to undergo dielectric breakdown when programmed.

8. A method comprising:
    forming a first electrode;
    forming a phase change material over said first electrode;
    forming a second electrode over said phase change material; and
    forming a second material, in the form of a chalcogenide layer, between said electrodes that increases the threshold voltage of said phase change material.

9. The method of claim 8 including forming said second material from a chalcogenide that does not convert from the amorphous state.

10. The method of claim 8 including forming said second material between said phase change material and said first electrode.

11. The method of claim 8 including forming said second material within said phase change material.

12. The method of claim 8 including forming said second material to breakdown when the phase change material is programmed.

13. The method of claim 12 including forming said second material to form a pore when said phase change material is programmed.

14. The method of claim 13 including forming said second material to undergo dielectric breakdown once a phase change material is programmed.

* * * * *